United States Patent
Eubanks

(10) Patent No.: US 7,565,122 B2
(45) Date of Patent: *Jul. 21, 2009

(54) SYSTEM AND METHOD FOR PROVIDING AUTOMATIC TUNING OF A RADIO RECEIVER AND FOR PROVIDING AUTOMATIC CONTROL OF A CD/TAPE PLAYER

(75) Inventor: Thomas M. Eubanks, Edinburg, TX (US)

(73) Assignee: ConPact, Inc., Durham, NC (US)

( * ) Notice: Subject to any disclaimer, the term of this patent is extended or adjusted under 35 U.S.C. 154(b) by 955 days.

This patent is subject to a terminal disclaimer.

(21) Appl. No.: 10/769,901

(22) Filed: Feb. 3, 2004

(65) Prior Publication Data

US 2004/0157570 A1    Aug. 12, 2004

Related U.S. Application Data

(63) Continuation of application No. 09/460,131, filed on Dec. 13, 1999, now Pat. No. 6,704,553, which is a continuation-in-part of application No. 08/946,865, filed on Oct. 8, 1997, now abandoned.

(51) Int. Cl.
*H04B 1/18* (2006.01)
(52) U.S. Cl. .................................. 455/186.1; 455/166.2
(58) Field of Classification Search .............. 455/185.1, 455/186.1, 186.2, 184.1, 161.1, 166.1, 166.2, 455/154.1; 707/104.1
See application file for complete search history.

(56) References Cited

U.S. PATENT DOCUMENTS 4,383,135 A * 5/1983 Scott et al. .................. 704/236

(Continued)

FOREIGN PATENT DOCUMENTS

EP    0841180 A2    5/1998

(Continued)

OTHER PUBLICATIONS

Napster™ Licenses Relatable's New Commercial Release of TRM™ Acoustic Fingerprinting Technology, Apr. 30, 2001.

(Continued)

*Primary Examiner*—Jean Gelin
(74) *Attorney, Agent, or Firm*—Withrow & Terranova, PLLC

(57) ABSTRACT

A sound system with a radio receiver having the ability to automatically tune to a new radio station if (a) the current radio station is broadcasting a song, program or other content that the user dislikes and/or (b) one of one or more predetermined radio stations is broadcasting content that the listener likes. In one embodiment, the sound system includes a tuner for tuning to a frequency of a radio station and for converting a radio signal transmitted by the radio station to an audio signal; a memory unit for storing a first set of templates, wherein the first set of templates correspond to a to a set of songs, programs, commercials, or other content disliked by the user of the sound system; and a recognition processor, coupled to the tuner and to the memory unit, for receiving the audio signal, generating templates from the audio signal, and comparing the generated templates to at least one of the templates within the first set of templates. If one of the generated templates matches one of the templates within the first set of templates, the tuner is automatically tuned to a new radio station. In this manner, the sound system automatically tunes to a new radio station when the current radio station broadcasts content that the user of the sound system has indicated a dislike thereof.

7 Claims, 7 Drawing Sheets

U.S. PATENT DOCUMENTS

| | | | |
|---|---|---|---|
| 4,692,041 A | 9/1987 | Dyma et al. | |
| 5,080,513 A | 1/1992 | Clary | |
| 5,119,507 A | 6/1992 | Mankovitz | 455/154.1 |
| 5,274,567 A | 12/1993 | Kallin et al. | |
| 5,430,698 A * | 7/1995 | Nonaka et al. | 369/30.1 |
| 5,472,287 A | 12/1995 | Hasegawa et al. | |
| 5,548,828 A | 8/1996 | Kozaki et al. | 455/161.2 |
| 5,564,037 A | 10/1996 | Lam | |
| 5,579,537 A | 11/1996 | Takahisa | 455/66 |
| 5,654,719 A * | 8/1997 | Kunii | 342/451 |
| 5,704,017 A * | 12/1997 | Heckerman et al. | 706/12 |
| 5,757,939 A * | 5/1998 | Begeja et al. | 381/98 |
| 5,790,754 A | 8/1998 | Mozer et al. | 395/2.41 |
| 5,842,161 A | 11/1998 | Cohrs et al. | 704/251 |
| 5,864,753 A | 1/1999 | Morita et al. | 455/136.1 |
| 5,872,747 A * | 2/1999 | Johnson | 369/30.08 |
| 5,898,910 A | 4/1999 | Miyake et al. | 455/186.1 |
| 6,011,854 A | 1/2000 | Van Ryzin | 381/77 |
| 6,021,320 A | 2/2000 | Bickford et al. | 455/186.1 |
| 6,103,985 A | 8/2000 | Shell et al. | |
| 6,129,270 A | 10/2000 | Piazza | |
| 6,161,002 A | 12/2000 | Migliaccio et al. | 455/150.1 |
| 6,173,165 B1 | 1/2001 | Rühl et al. | 455/186.1 |
| 6,175,537 B1 * | 1/2001 | Fleming, III | 369/30.06 |
| 6,203,223 B1 | 3/2001 | Nakayama et al. | |
| 6,240,280 B1 | 5/2001 | Ravi et al. | 455/161.1 |
| 6,249,303 B1 | 6/2001 | Mochizuki et al. | |
| 6,257,783 B1 | 7/2001 | Hanaoka et al. | |
| 6,314,577 B1 * | 11/2001 | Pocock | 725/93 |
| 6,361,163 B1 | 3/2002 | Fowlkes | |
| 6,447,182 B2 | 9/2002 | Brewington et al. | |
| 6,484,141 B1 | 11/2002 | Tomoeda | 704/254 |
| 7,056,047 B2 | 6/2006 | Sasaki et al. | |
| 2001/0016137 A1 | 8/2001 | Omura | |

FOREIGN PATENT DOCUMENTS

| | | |
|---|---|---|
| EP | 0 841 160 A2 | 5/1999 |
| JP | 4-316157 | 11/1992 |
| JP | 06-15893 | 1/1994 |
| JP | 06-271167 | 9/1994 |
| JP | 11-193159 | 7/1999 |
| JP | 11-334121 | 12/1999 |
| JP | 11-348364 | 12/1999 |
| JP | 11-349203 | 12/1999 |
| JP | 2000-280576 | 10/2000 |
| JP | 2000-344428 | 12/2000 |
| JP | 2001-63893 | 3/2001 |

OTHER PUBLICATIONS

TRM™: Advanced Audio Fingerprinting from Relatable, Apr. 30, 2001.

RSC Development Kit Manual, copyright 1996 Sensory, Inc., Aug. 1996, 303 pages.

Austrian Patent Office action which issued in the corresponding Singapore Patent Application, citing the above reference.

* cited by examiner

SYSTEM AND METHOD FOR PROVIDING AUTOMATIC TUNING OF A RADIO RECEIVER AND FOR PROVIDING AUTOMATIC CONTROL OF A CD/TAPE PLAYER

This application is a continuation of U.S. patent application Ser. No. 09/460,131, filed Dec. 13, 1999, now U.S. Pat. No. 6,704,553, which is a continuation-in-part of U.S. patent application Ser. No. 08/946,865, filed Oct. 8, 1997 (abandoned), the entire contents of which are incorporated by reference herein.

BACKGROUND OF THE INVENTION

1. Field of the Invention

The present invention relates to sound systems, and more specifically to sound systems having a radio receiver and/or CD/Tape player.

2. Discussion of the Background

Conventional sound systems have features that make it easy for a listener to find a song or program that the listener enjoys. For example, a radio receiver of a conventional sound system typically has a scan push button that causes the radio receiver to scan the available radio stations. When the listener hears a song or program he or she likes, the listener again activates the scan button to stop the radio receiver from scanning. Another feature provided by conventional radio receives are preset push buttons. A listener can program the preset buttons so that each button is associated with a unique radio station. When the listener activates one of the programmed preset buttons, the radio receiver automatically tunes to the station associated with the activated preset. With this feature, a listener can easily and quickly change stations if the current station is broadcasting a song, program, commercial, or other content the listener does not enjoy.

The drawback of these features is that frequently the listener is too preoccupied with other matters to activate one of the above described buttons. This is particularly true when the listener is driving a car or is entertaining a guest and does not want to interrupt what he or she is doing simply to change the station. Thus, there will be times when the listener has no choice but to listen to an unpleasant song or commercial.

Therefore, what is a desired is a system and method that overcomes the above disadvantages of conventional sound systems.

SUMMARY OF THE INVENTION

The present invention provides, among other things, a sound system with a radio receiver having the ability to automatically tune to a new radio station if (a) the current radio station is broadcasting a song, program or other content that the user dislikes and/or (b) one of one or more predetermined radio stations is broadcasting content that the listener likes. Preferably, the sound system also includes a CD/Tape player having the ability to automatically skip a song that the user has indicated a dislike thereof.

In one aspect, the sound system allows the listener to specify a set of "disliked" content and a set of "liked" content. The sound system compares what the current radio station is broadcasting to the set of "disliked" content, and if there is a match automatically changes the station. Similarly, the sound system compares the set of "liked" content to that which a predetermined radio station is broadcasting, and if there is a match automatically tunes to the predetermined radio station.

In one aspect, the set of "disliked" content is represented by a first set of "templates", and the set of "liked" songs is represented by a second set of "templates." A template is a digital representation of a sample of an audio signal.

In one embodiment, the sound system includes a tuner for tuning to a radio station and for converting a signal transmitted by the radio station to an audio signal; a memory unit for storing the first set of templates; and a recognition processor, coupled to the tuner and to the memory unit, for receiving the audio signal, generating templates from the audio signal, and comparing the generated templates to at least one of the templates within the first set of templates. If one of the generated templates matches one of the templates within the first set of templates, the tuner is automatically tuned to a new radio station. In this manner, the sound system of the present invention automatically tunes to a new radio station when the current radio station broadcasts content that the user of the sound system has indicated a dislike thereof.

Further features and advantages of the present invention, as well as the structure and operation of various embodiments of the present invention, are described in detail below with reference to the accompanying drawings.

BRIEF DESCRIPTION OF THE DRAWINGS

The accompanying drawings, which are incorporated herein and form part of the specification, illustrate various embodiments of the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Figure 1:
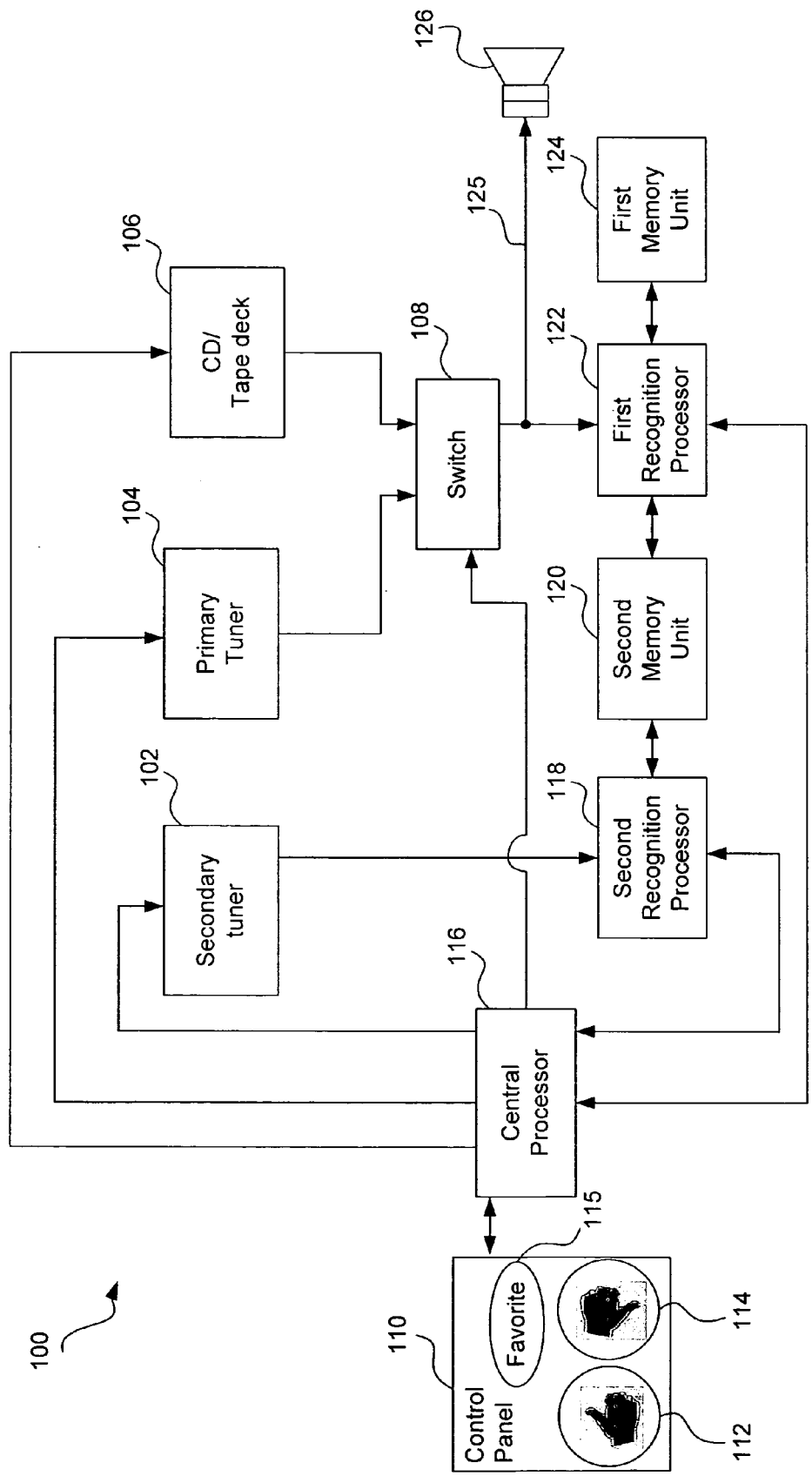
FIG. 1 is a block diagram of a sound system according to a preferred embodiment of the present invention.

FIG. 1 is a block diagram of a sound system 100 according to a preferred embodiment. Sound system 100 includes two tuners, a primary tuner 104 and a secondary tuner 102. It is contemplated that in an alternative embodiment of sound system 100 there are two or more secondary tuners 102. Additionally, in one embodiment, sound system 100 does not include any secondary tuners 102. However, in the interest of clarity and brevity, the present invention will be described in terms of the preferred embodiment, in which there is a single secondary tuner. Both primary tuner 104 and secondary tuner 102 convert a signal broadcast by a "radio station" into an audio signal.

The "radio station" can be a conventional radio station that broadcasts content through the air using radio waves, or the "radio station" can be a modem radio station that broadcasts content through a data network, such as the Internet. Consequently, in one embodiment, sound system 100 would include an antenna for receiving signals broadcasts via radio waves, and in another embodiment, sound system 100 would include a network connection for receiving signal broadcast through a network.

Primary tuner 104 and a CD/Tape player 106 are coupled through a switch 108 to a speaker system 126. In addition to including one or more speakers, speaker system 126 may include an amplifier (not shown) or other like component. The configuration of switch 108 determines whether the audio signal produced by tuner 104 or the audio signal produced by CD/Tape player 106 is provided to speaker system 126. The configuration of switch 108 is controlled by a central processor 116, which controls switch 108 based on input at a control panel 110.

Primary tuner 104 and CD/Tape player 106 are also coupled to a first recognition processor 122 through switch 108. That is, first recognition processor 122 either receives an audio signal from primary tuner 104 or from CD/Tape player 106 depending on the configuration of switch 108. The audio signal produced by secondary tuner 102 is provided to a second recognition processor 118.

First recognition processor 122 is coupled to a first memory unit 124 and a second memory unit 120. Second recognition processor 118 is coupled to second memory unit 120. Both first memory unit 124 and second memory unit 120 include memory, such as static or dynamic random access memory (RAM), read only memory (ROM), electrically erasable programmable ROM (EEPROM), and the like. Preferably, the memory included in both memory units 120 and 124 is non-volatile memory.

The Recognition Processors

Figure 2:
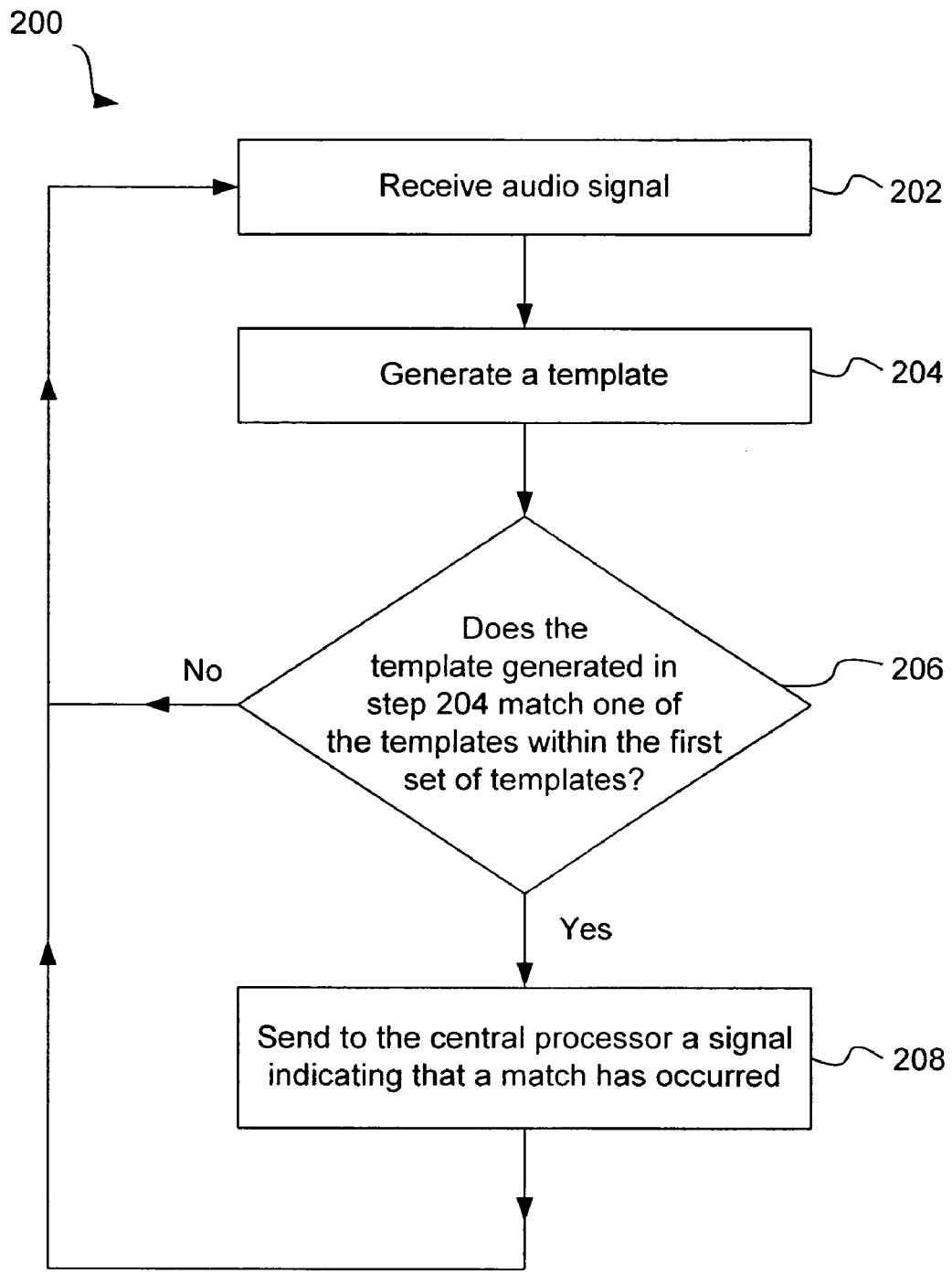
FIG. 2 is a flowchart showing operations performed by the first recognition processor.

The purpose of first recognition processor 122 is to enable sound system 100 to automatically skip songs and other content that the user has specified should be skipped. FIG. 2 is a flowchart showing a process 200 performed by first recognition processor 122 that enable sound system 100 to perform this function. Process 200 begins in step 202, where first recognition processor 122 receives an audio signal from switch 108. Next, first recognition processor 122 generates a "template" after it encounters an X second or greater period of silence in the audio signal (step 204). In one embodiment, X is about 0.5. As the term is used herein, a "template" is a digital representation of a sample of an audio signal. The sample of the audio signal from which first recognition processor 122 generates the template is the first Y seconds of the audio signal that immediately follows the X second or greater silence period. In one embodiment, Y is about 3 seconds. Because most radio stations insert a short silence period prior to playing a song, or broadcasting a program or a commercial, each template generated by first recognition processor 122 is usually a digital representation of the start of a song, program, or commercial.

After step 204, first recognition processor 122 compares its most recently generated template to previously created templates that are within a first set of templates (step 206). Preferably, each previously created template within the first set of templates is stored in first memory unit 124, but they may be stored in second memory unit 120 instead. Each previously created template within the first set of templates corresponds to a song, program, commercial, and the like (collectively referred to as "content") that a user of sound system 100 has indicated his or her dislike thereof. The procedure corresponding to how the user of sound system 100 indicates his or her dislike of a song is described further below.

If first recognition processor 122 determines that its most recently generated template "matches" one of the templates in the first set of templates, then control passes to step 208, otherwise control passes back to step 202. The term "matches" is used broadly herein, thus, one template "matches" another template if the two templates are either identical or similar. In step 208, first recognition processor 122 sends to central processor 116 a control signal indicating that a match has occurred. After step 208, control passes back to step 202.

After receiving from first recognition processor 122 the control signal indicating that a match has occurred, central processor 116 determines which one of the primary tuner 104 and the CD/Tape player 106 is currently coupled to speaker system 126 through switch 108. If central processor 116 determines that primary tuner 104 is currently coupled to speaker system 126, then central processor 116 sends to primary tuner 104 a command signal that causes primary tuner 104 to tune to a new frequency. If central processor 116 determines that CD/Tape player 106 is currently coupled to speaker, system 126, then central processor 116 sends to CD/Tape player 106 a command signal that causes it to skip to the next song on the CD or the Tape. In this manner, sound system 100 automatically skip songs, commercials, or other content that the user has indicated a dislike thereof.

Figure 3:
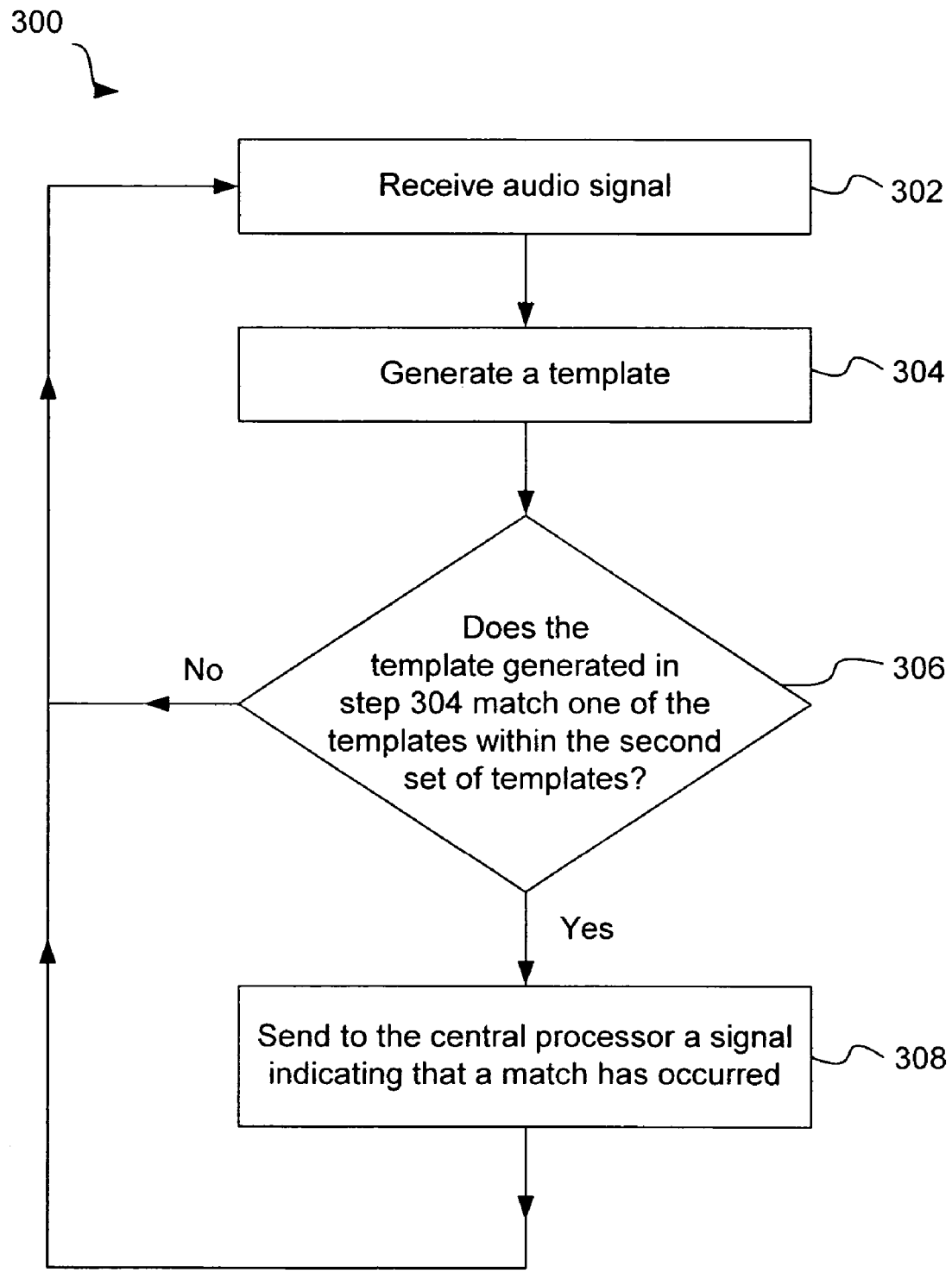
FIG. 3 is a flowchart showing operations performed by the second recognition processor.
Figure 4A:
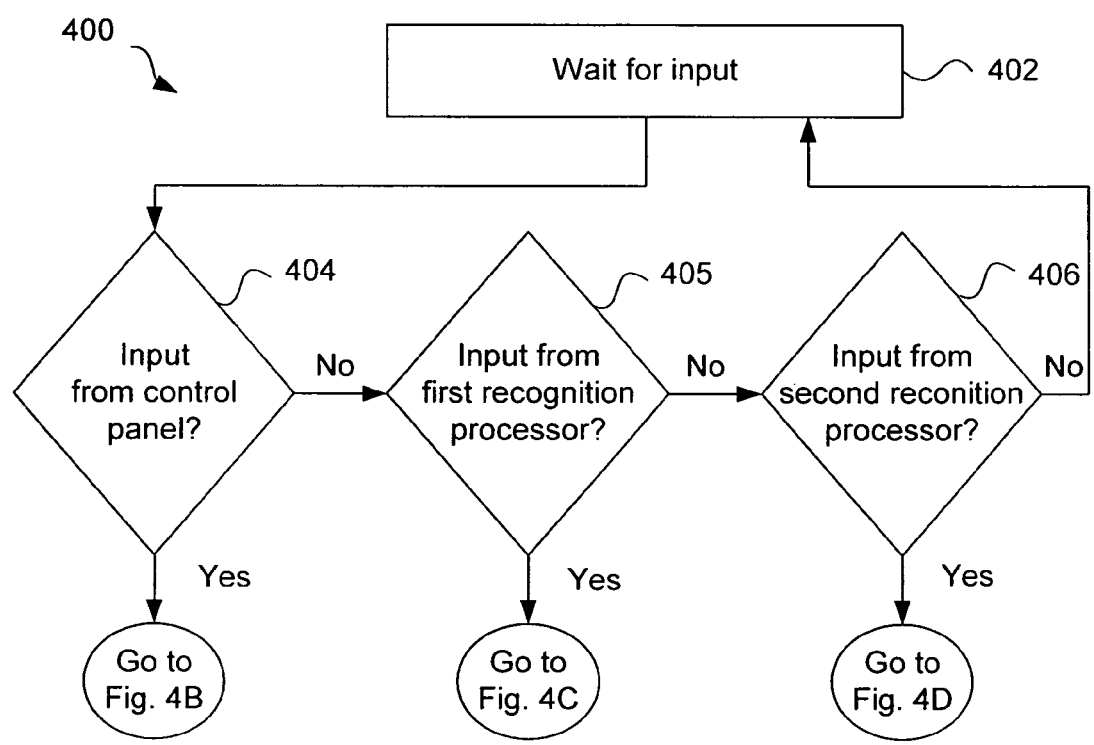
FIGS. 4A-D are flowcharts showing operations performed by the central processor.
Figure 4B:
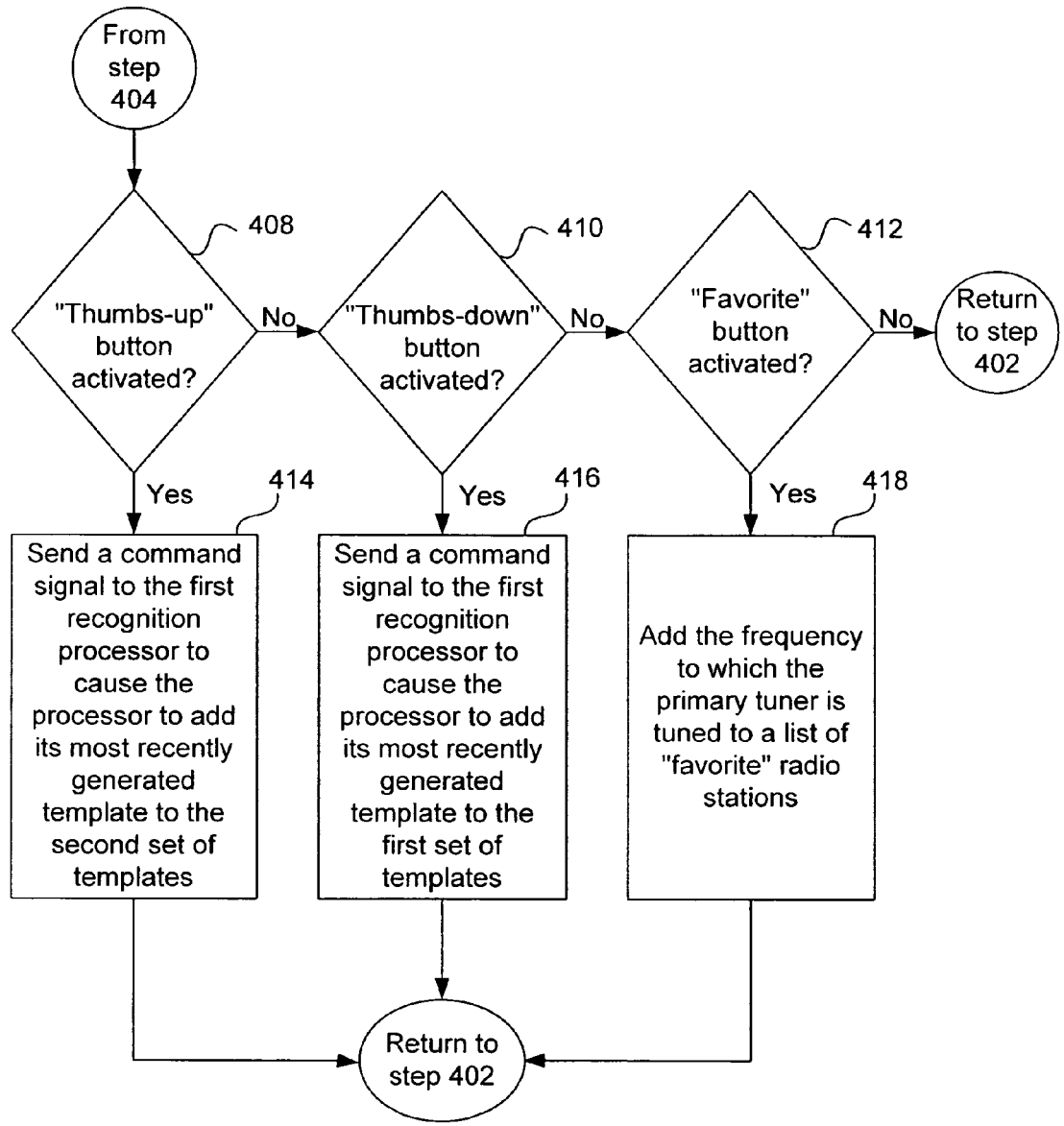
Figure 4C:
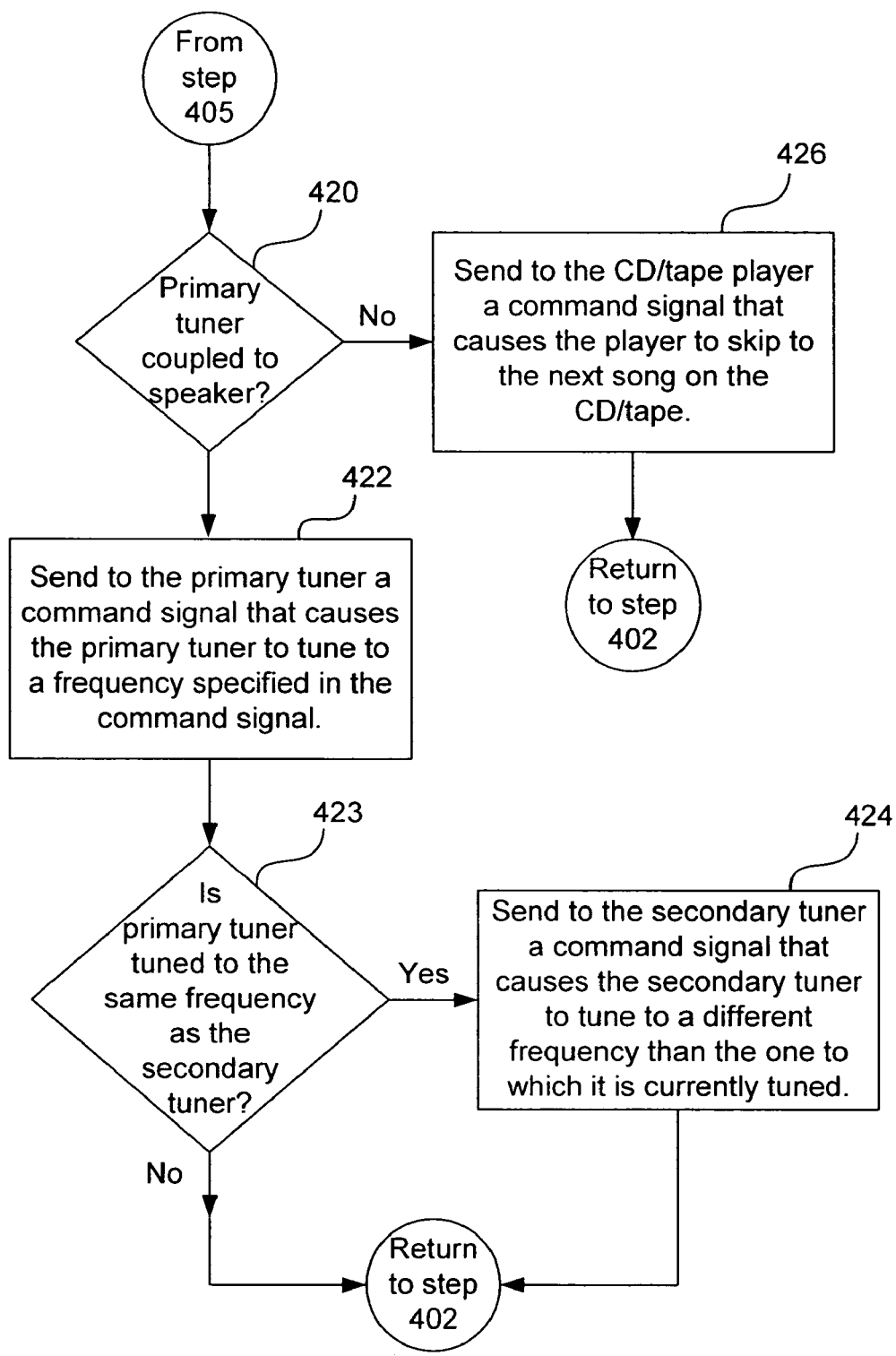
Figure 4D:
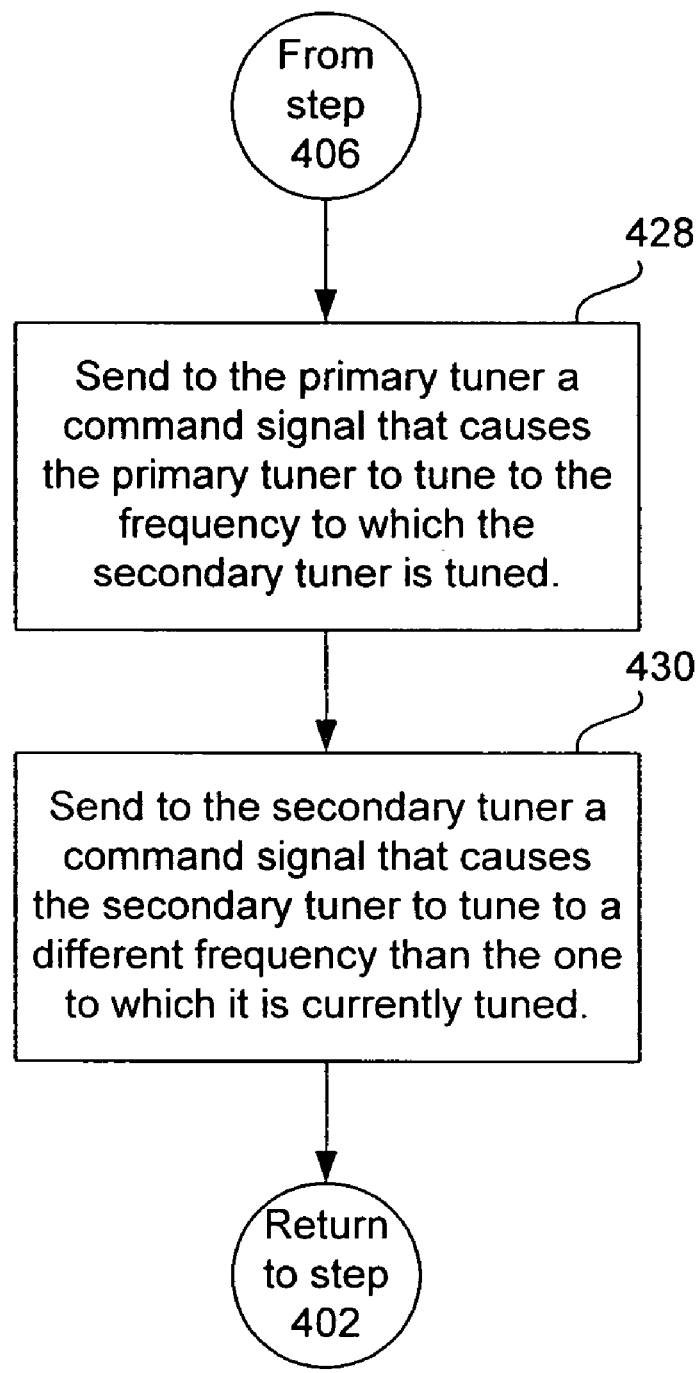

Referring now to second recognition processor 118, the purpose of second recognition processor 118 is to enable sound system 100 to switch to the songs for which the user has a listening preference. FIG. 3 is a flowchart illustrating a process 300 performed by second recognition processor 118 that enable sound system 100 to perform this function. Process 300 begins with step 302, where second recognition processor 118 receives an audio signal from secondary tuner 102. Next, after second recognition processor 118 encounters an X second or greater period of silence in the audio signal, second recognition processor 118 generates a template from a sample of the audio signal (step 304). The sample of the audio signal that second recognition processor 118 uses to generate the template is the first Y seconds of the audio signal that immediately follows the X second or greater silence period. X is typically about 0.5 seconds and Y is typically about 3 seconds. As discussed above, most radio stations insert a short silence period prior to playing a song, or broadcasting a program or a commercial. Thus, each template generated by second recognition processor 118 is usually a representation of the start of a song, program, or commercial.

After step 304, second recognition processor 118 compares its most recently generated template to previously created templates that are within a second set of templates (step 306). Each template within the second set of templates corresponds to content (e.g., a particular song) for which the user of sound system 100 has indicated a listening preference. Preferably, each template within the second set of templates is stored in second memory unit 124. The procedure corresponding to how the user of sound system 100 indicates that he or she has a listening preference for a particular song is described further below.

If second recognition processor 118 determines that its most recently generated template matches one of the templates in the second set of templates, control passes to step 308, otherwise control passes back to step 302. In step 308, second recognition processor 118 sends to central processor 116 a control signal indicating that a match has occurred. After step 308, control passes back to step 302.

After receiving from second recognition processor 118 the control signal indicating that a match has occurred, central processor 116 sends to primary tuner 104 a command signal that causes primary tuner 104 to tune to the frequency to which secondary tuner is currently tuned. Thereafter, central processor 116 sends to secondary tuner 102 a command signal causing secondary tuner 102 to tune to a new radio station. In this manner, sound system 100 automatically causes primary tuner 104 to tune to the radio station to which secondary tuner 102 was tuned whenever that radio station broadcasts content for which the user has indicated a listening preference.

First and second recognition processors 118 and 122 can be implemented with either special purpose processor or general purpose processors. The process for generating and matching templates performed by the recognition processors can be any conventional speech/audio recognition algorithm. One such algorithm is described in U.S. Pat. No. 5,790,754, to Mozer et al., entitled, "Speech Recognition Apparatus for Consumer Electronic Applications," the entire contents of which are incorporated herein by reference. In one specific embodiment, recognition processors 118 and 122 are each implemented with the RSC-364 integrated circuit sold by Sensory Circuits, Inc. of Sunnyvale Calif. The RSC-364 is an 8-bit micro-controller designed specifically for speech applications in consumer electronic products.

Adding and Deleting Templates to the First and Second Set of Templates

The user of sound system 100 indicates that he or she dislikes a particular song, program, commercial or other content by activating a "thumbs-down" push button 114 when the particular song, program, or commercial is being outputted by sound system 100. Similarly, the user of sound system 100 indicates that he or she has a listening preference for a particular song, program, commercial or other content by activating a "thumbs-up" push button 112 when the particular song, program, or commercial is being outputted by sound system 100.

As discussed above with reference to FIG. 2, first recognition processor 122 continuously generates templates. In response to the user activating the "thumbs-down" button 114, central processor 116 directs (i.e., causes) first recognition processor 122 to add its most recently generated template to the first set of templates. That is, when the user activates thumbs-down button 114 a signal indicating the activation is sent from the control panel 110 to the central processor 116. In response to receiving this signal, the central processor 116 sends a control signal to first recognition processor 122 that causes first recognition processor 122 to include its most recently generated template in the first set of templates. In one embodiment, first recognition processor 122 includes a template in the first set of templates by storing the template in a linked list or in a table residing in either first memory unit 124 or second memory unit 120. Preferably, however, all of the templates within the first set of templates are stored in first memory unit 124, as opposed to second memory unit 120.

In response to the user activating the "thumbs-up" button 112, central processor 116 directs first recognition processor 122 to include its most recently generated template in the second set of templates. In one embodiment, first recognition processor 122 includes a template in the second set of templates by storing the template in a linked list or in a table residing in second memory unit 120.

Thus, the user should only activate thumbs-up button 112 when the output. 125 of sound system 100 is an output that the user prefers to listen to more than almost any other content. Further, the user should only activate thumbs-down button 114 when the output 125 of sound system 100 is an output that the user would prefer never to have to listen to.

In response to the user activating both the thumbs-up button 112 and the thumbs-down button 114, central processor 116 causes first recognition processor 122 to delete the last matched template from memory.

Central Processor 116

FIGS. 4A-D are flow charts showing a portion of the operating sequence of central processor 116. As shown in FIGS. 4A-D, central processor 116 first waits for an input (step 402). In steps 404, 405, and 406 central processor 116 determines whether the input is from control panel 110, first recognition processor 122, or second recognition processor 118.

If the input is from control panel 100, central processor 116 determines which button was activated (steps 408, 410 and 412). If thumbs-up button 112 was activated, central processor 116 directs first recognition processor 122 to add its most recently generated template to the second set of templates (step 414). If thumbs-down button 114 was activated, central processor 116 directs first recognition processor 122 to add its most recently generated template to the first set of templates (step 416). If a "favorite" button 115 is activated, central processor 116 adds the frequency at which the primary tuner 104 is tuned to a list of "favorite" radio stations (step 418). Preferably, the user adds at least two radio stations to the "favorite radio station" list. In this way, primary tuner 104 can be tuned to one of the user's favorite radio stations, while the secondary tuner 102 is tuned to another one of the user's favorite radio stations.

As an optional feature, when the user activates thumbs-up button 112, central processor 116 will store the current volume setting with the stored template. Thus, when the stored template is matched with a current template, central processor 116 will not only cause primary tuner 104 to change frequencies to the frequency at which secondary tuner 102 is tuned, but also adjust the volume level to the volume setting stored with the matched template. In this way, not only can the user of sound system 100 specify the songs the he or she likes, but also the volume at which he or she likes to listen to the songs.

If the input is from first recognition processor 122 and the input is a control signal indicating that a template match has occurred, then central processor 116 determines which one of the primary tuner 104 and the CD/Tape player 106 is currently coupled to speaker system 126 through switch 108 (step 420). If central processor 116 determines that primary tuner 104 is currently coupled to speaker system 126, then central processor 116 sends to primary tuner 104 a command signal that causes primary tuner 104 to tune to a new frequency (step 422). Preferably, the new frequency to which the primary tuner is tuned is one of the frequencies stored in the "favorite radio station" list, which is described above. In this manner, sound system 100 automatically tunes to one of the listener's favorite radio stations when the current radio station to which sound system is tuned is broadcasting disliked content. If as a result of step 422, primary tuner 104 is tuned to the same frequency as secondary tuner 102, central processor 116 will send to secondary tuner 102 a command signal that causes secondary tuner 102 to tune to a new frequency (step 425). In this way, it is ensured that primary tuner 104 and secondary tuner 102 are not tuned to the same frequency, which would defeat the purpose of having a secondary tuner 102.

If central processor 116 determines that CD/Tape player 106 is currently coupled to speaker system 126, then central processor 116 sends to CD/Tape player 106 a command signal that causes CD/Tape player 106 to skip to the next song on the CD or the Tape (step 426). In this manner, sound system 100 automatically skips songs the listener has indicated he or she does not like.

If the input is from second recognition processor 118 and the input is a control signal indicating that a template match has occurred, central processor 116 sends to primary tuner 104 a command signal that causes primary tuner 104 to tune to the frequency to which secondary tuner 102 is tuned (step 428) and, thereafter, sends to secondary tuner 102 a command signal that causes secondary tuner 102 to tune to a new frequency (step 430). Preferably, the new frequency to which secondary tuner 102 is tuned is one of the frequencies stored in the "favorite radio station" list. In this manner, sound system 100 automatically causes primary tuner 104 to tune to the radio station to which secondary tuner 102 was tuned whenever that radio station broadcasts content for which the user has indicated a listening preference.

Sound system 100 may further include an input/output interface (not shown) for interfacing sound system 100 with a network or other device for the purpose of downloading previously created templates in to memory unit 120 and/or memory unit 124. For example, sound system 100 could include an input/output port for connecting to a disk drive. In this embodiment, a user of sound system 100 would insert into the disk drive a disk having templates stored thereon. The templates could then be copied from the disk to memory within sound system 100.

While various embodiments/variations of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A system, comprising:
   at least one control panel;
   means for producing an audio signal;
   a speaker system, coupled to said audio signal producing means, for emitting sound associated with said audio signal;
   means for generating a template from said audio signal;
   means for determining whether a user of the system has activated a predetermined push button or buttons provided on said at least one control panel; and
   adding means for adding said template to at least one of two or more sets of templates, wherein said adding means adds said template to said at least one of said two or more sets of templates if said determining means determines that said user has activated said predetermined push button or buttons.

2. The system of claim 1, wherein said means for producing an audio signal is a tuner that receives a signal transmitted from a radio station and produces said audio signal from said signal.

3. The system of claim 1, wherein said means for producing an audio signal is a compact disc player.

4. In a sound system having at least one control panel, a method for adding a template to a set of templates, comprising:
   producing an audio signal;
   generating the template from said audio signal;
   determining whether a user of the system has indicated a dislike of content associated with said audio signal; and
   adding said template to the set of templates if said determining means determines that said user has indicated a dislike of the content associated with said audio signal.

5. The method of claim 4, wherein the step of determining whether a user of the system has indicated a dislike of the content associated with said audio signal comprises the step of determining whether a user of the system has activated a predetermined push button or buttons provided on the at least one control panel.

6. In a sound system having at least one control panel, a method for adding a template to a set of templates, comprising:
   producing an audio signal;
   generating the template from said audio signal;
   determining whether a user of the system has indicated a listening preference for content associated with said audio signal; and
   adding said template to the set of templates if said determining means determines that said user has indicated a listening preference for the content associated with said audio signal.

7. The method of claim 6, wherein the step of determining whether a user of the system has indicated a listening preference for the content associated with said audio signal comprises the step of determining whether a user of the system has activated a predetermined push button or buttons provided on the at least one control panel.

* * * * *